United States Patent [19]

Mohsen et al.

[11] Patent Number: 4,943,538

[45] Date of Patent: Jul. 24, 1990

[54] PROGRAMMABLE LOW IMPEDANCE ANTI-FUSE ELEMENT

[75] Inventors: Amr M. Mohsen, Saratoga; Esmat Z. Hamdy, Fremont; John L. McCullum, Saratoga, all of Calif.

[73] Assignee: Actel Corporation, Sunnyvale, Calif.

[21] Appl. No.: 166,324

[22] Filed: Mar. 10, 1988

Related U.S. Application Data

[62] Division of Ser. No. 861,519, May 9, 1986.

[51] Int. Cl.⁵ .................... H01L 21/22; H01L 21/465
[52] U.S. Cl. .......................... 437/52; 437/40;
  437/59; 437/170; 437/193; 437/922
[58] Field of Search .................... 352/45; 365/96, 105,
  365/186, 175; 437/170, 172, 136

[56] References Cited

U.S. PATENT DOCUMENTS

| | | | |
|---|---|---|---|
| 3,576,549 | 4/1971 | Hess | 437/172 |
| 3,717,852 | 2/1973 | Abbas et al. | 437/172 |
| 3,742,592 | 7/1973 | Rizzi et al. | 437/172 |
| 3,781,977 | 1/1974 | Hulmes | 437/172 |
| 3,787,822 | 1/1974 | Rioult | 437/172 |
| 4,046,607 | 9/1977 | Inoue et al. | 437/162 |
| 4,099,260 | 7/1978 | Lynes et al. | 365/105 |
| 4,145,803 | 3/1979 | Tasch, Jr. | 437/52 |
| 4,282,648 | 8/1981 | Yu et al. | 437/162 |
| 4,295,897 | 10/1981 | Tubbs et al. | 437/34 |
| 4,502,208 | 3/1985 | McPherson | 365/96 |
| 4,507,757 | 3/1985 | McElroy | 365/96 |
| 4,543,594 | 9/1985 | Mohsem et al. | 357/51 |
| 4,603,059 | 7/1986 | Kiyosumi | 437/919 |
| 4,635,345 | 1/1987 | Hankins et al. | 437/59 |

OTHER PUBLICATIONS

Baitinger "Manufacturing High-Frequency Diodes", IBM TDB, vol. 13, No. 13, Mar. 1971, 3159.

Primary Examiner—Brian E. Hearn
Assistant Examiner—T. Thomas
Attorney, Agent, or Firm—Lyon & Lyon

[57] ABSTRACT

An electrically programmable low impedance circuit element is disclosed having capacitor-like structure with very low leakage before programming and a low resistance after programming. The electrically programmable low impedance circuit element of the present invention includes a lower conductive electrode which may be formed of a metal or semiconductor material, an insulating layer, which, in a preferred embodiment includes a first layer of silicon dioxide, a second layer of silicon nitride and a third layer of silicon dioxide. An upper electrode formed of a metal or of a semiconductor material of the same conductivity type of the lower electrode or a sandwich of both completes the structure.

6 Claims, 3 Drawing Sheets

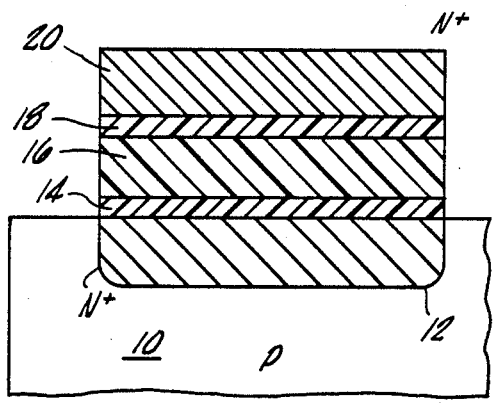
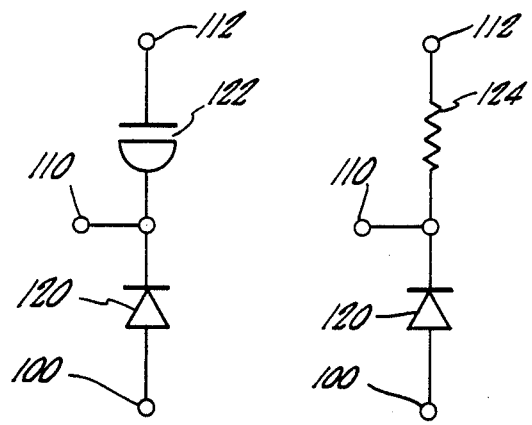
FIG_1.   FIG_5A.   FIG_5B.
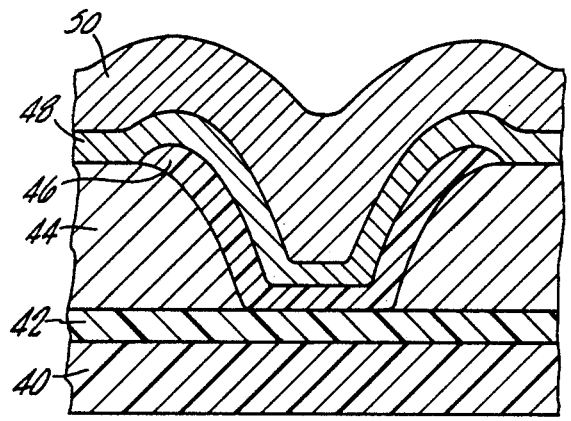
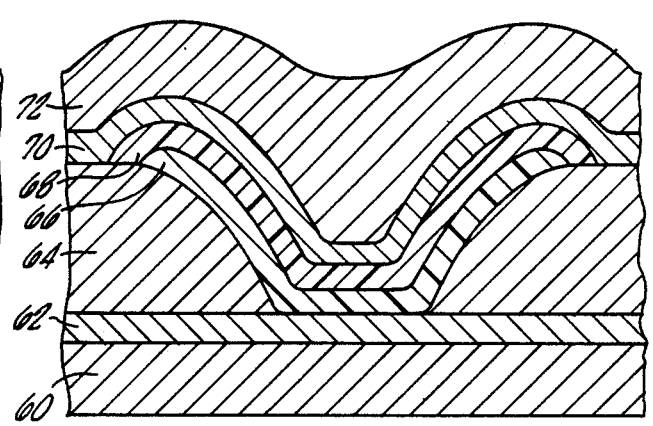
FIG_2A.   FIG_2B.
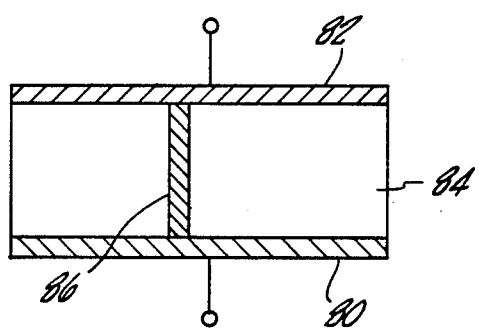
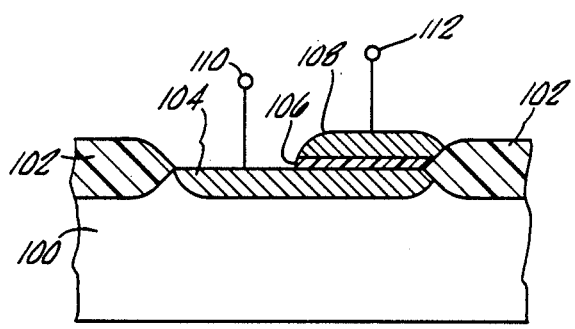
FIG_3.   FIG_4.

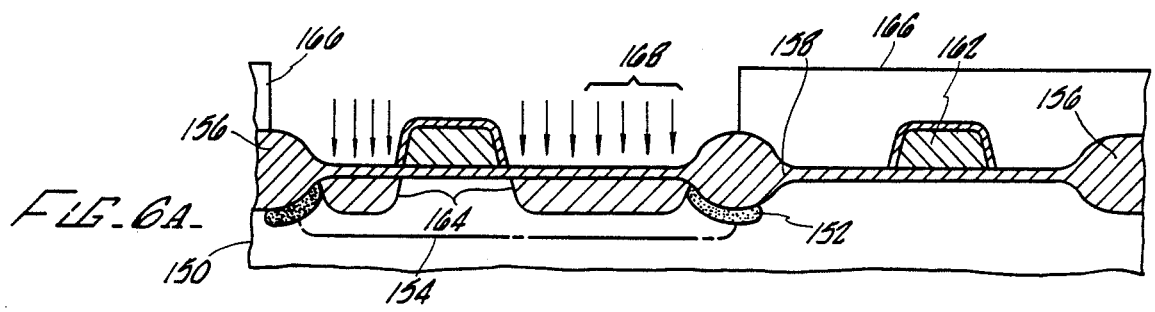
FIG_6A_
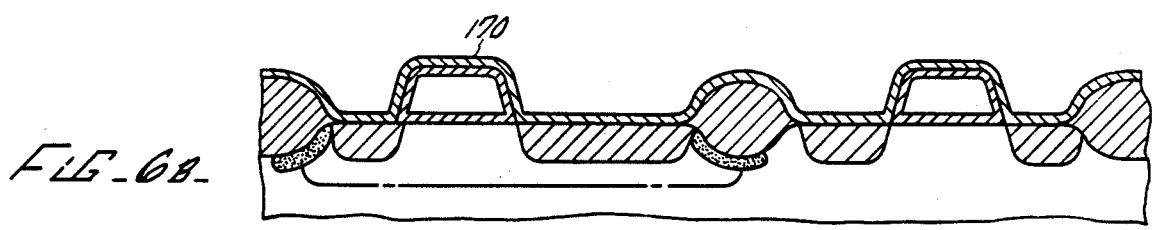
FIG_6B_
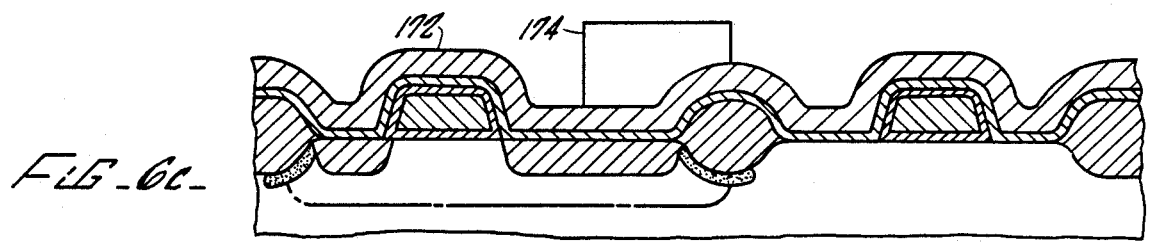
FIG_6C_
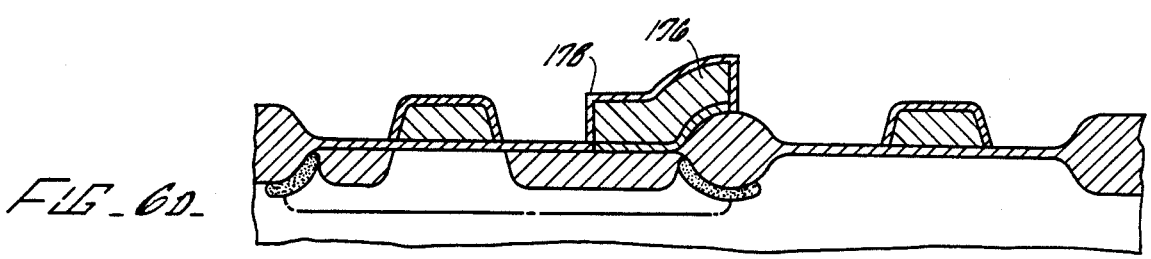
FIG_6D_
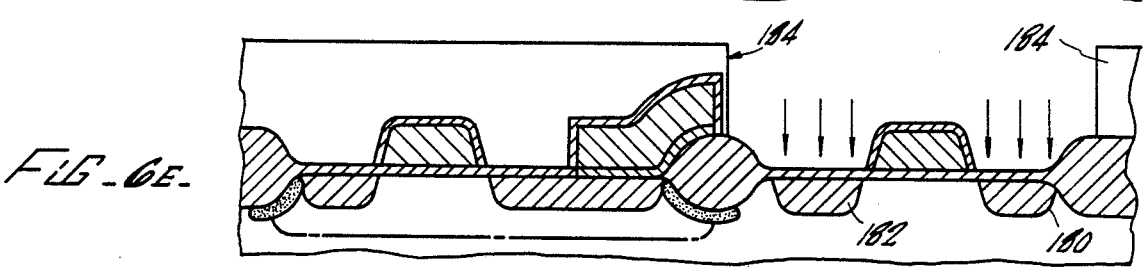
FIG_6E_
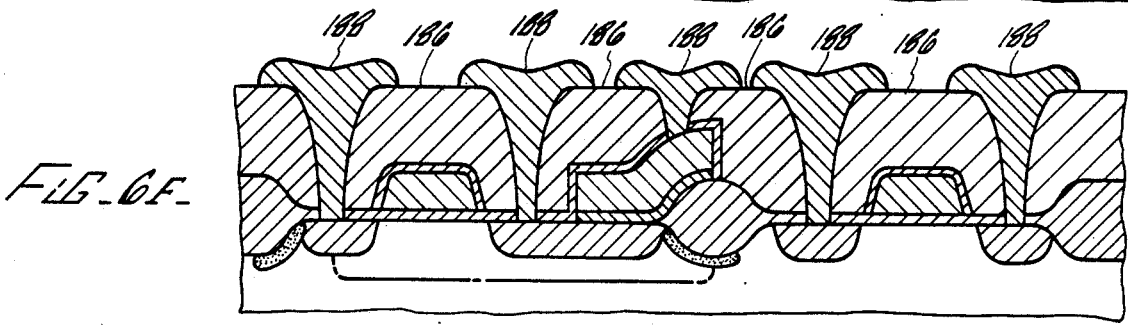
FIG_6F_

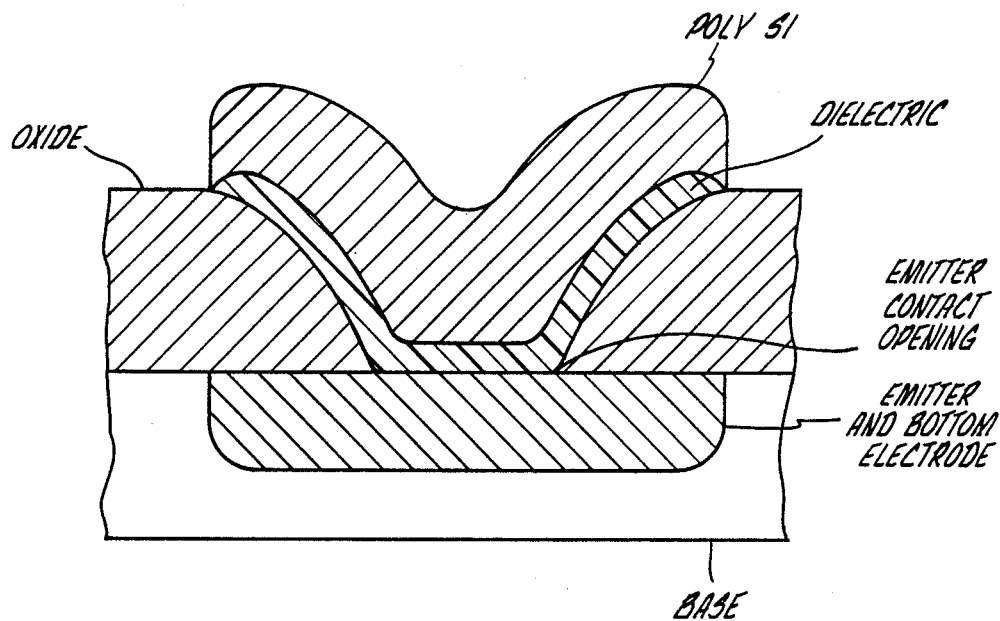
FIG_7.

PROGRAMMABLE LOW IMPEDANCE ANTI-FUSE ELEMENT

This is a division of application Ser. No. 861,519, filed May 9, 1986.

BACKGROUND

1. Field of the Invention

The present invention relates to the field of integrated electronic circuit technology. More particularly, the invention relates to a reliable and manufacturable capacitor-like, electrically-programmable interconnect device to be used in integrated circuits.

2. The Prior Art

Integrated electronic circuits are usually made with all internal connections set during the manufacturing process. However, because of high development costs, long lead times, and high manufacturing tooling costs of such circuits, users often desire circuits which can be configured or programmed in the field. Such circuits are called programmable circuits and they usually contain programmable links. Programmable links are electrical interconnects which are either broken or created at selected electronic nodes by the user after the integrated device has been fabricated and packaged in order to activate or deactivate respectfully the selected electronic nodes.

Programmable links have been used extensively in programmable read only memory devices (PROMs). Probably the most common form of programmable link is a fusible link. When a user receives a PROM device from a manufacturer, it usually consists of an X-Y matrix or lattice of conductors or semiconductors. At each cross-over point of the lattice a conducting link, called a fusible link, connects a transistor or other electronic node to this lattice network. The PROM is programmed by blowing the fusible links to selected nodes and creating an open circuit. The combination of blown and unblown links represents a digital bit pattern of ones and zeros signifying data which the user wishes to store in the PROM.

Such fusible link PROM systems present certain disadvantages. For instance, because of the nature of the conducting material in the link, relatively high voltage and high current levels are needed during programming to guarantee the complete blowing of the fusible links. Since the link is usually conductive, it needs large amounts of power dissipation to blow it. Also, the shape and size of the fusible link must be precise so that the link will function effectively as a conductor if it is not blown and will be a completely open circuit if it is blown. Therefore, very critical photolithographic steps and controlled etch techniques are required during the manufacturing process of fusible link PROMs. Finally, a large gap must be blown in the link in order to prevent it from later becoming closed through the accumulation of the conducting material near the blown gap. Fusible link memory cells are relatively large in order to accommodate the link and its associated selection transistor and, therefore, fusible link PROM systems have high manufacturing and material costs and take up large amounts of chip real estate space.

In recent years, a second type of programmable links, called anti-fuse links, have been developed for use in integrated circuit applications. Instead of the programming mechanism causing an open circuit as is the case with fusible links, the programming mechanism in anti-fuse circuits creates a short circuit or relatively low resistance link. Anti-fuse links consist of two conductor and/or semiconductor materials having some kind of a dielectric or insulating material between them. During programming, the dielectric at selected points in between the conductive materials is broken down by predetermined applied voltages, thereby electrically connecting the conducting or semiconducting materials together.

Various materials have been suggested for the dielectric or insulating layer. Some of these suggested dielectric materials require a relatively high current and voltage during programming, require complex manufacturing techniques and have low reliability during programming because it is difficult to control the reproducibility of the conductive state due to the nature of the crystalline structures of the materials involved. In addition, the programming process results in a link having a finite resistance in the order of several hundred to several thousand ohms. This characteristic of the known anti-fuse elements renders them relatively unsuitable for use in high speed circuits.

Some of the proposed dielectric insulators are doped amorphous silicon alloys, polycrystalline resistors, oxides, titanate of a transition metal, silicon oxide, aluminum oxide and cadmium sulfide. The problems with these approaches, have been related to the need of a high current and voltage to program and the difficulty to manufacture and control their reliability in both the on and off states. Materials such as cadmium sulfide, aluminum oxide and titanate, present complicated technological problems because they are difficult to integrate into standard semiconductor processing. Capacitors with silicon oxides used as a dielectric do not produce a low enough impedance after programming.

Examples of known anti-fuse elements are found in the prior art using various insulating materials. Reference is made to: U.S. Pat. No. 3,423,646 which uses aluminum oxide, cadmium sulfide; U.S. Pat. No. 3,634,929 which uses single film of $AL_2O_3$, $SiO_2$, and $Si_3N_4$; U.S. Pat. No. 4,322,822 which uses $SiO_2$; U.S. Pat. No. 4,488,262 which uses oxide or titanate of a transition metal; U.S. Pat. No. 4,499,557 which uses doped amorphous silicon alloy; U.S. Pat. No. 4,502,208 which uses $SiO_2$; U.S. Pat. No. 4,507,757 which uses $SiO_2$; U.S. Pat. No. 4,543,594 which uses $SiO_2$.

Most of the above patents either describe complicated technologies or need high breakdown voltages and currents, and or are difficult to manufacture or do not meet the reliability requirements of state-of-the-art integrated circuits in both the on and off states. These patents do not disclose the creation of controllable conductive filaments with low resistance after programming.

Other problems associated with existing dielectric materials in anti-fuse links include large memory cells, and complex manufacturing processes for the unblown anti-fuse elements

OBJECTS AND ADVANTAGES

An object of the present invention is to provide an electrically programmable low-impedance interconnect element.

Another object of the present invention is to provide an electrically programmable interconnect element which may be programmed with sufficiently low voltages and currents compatible with state-of-the-art MOS technology, resulting in a low impedance in the on-state.

Another object of the present invention is to provide an electrically-programmable interconnect element which is manufacturable using standard semiconductor processing and has high reliability in both the on and off states.

Advantages associated with the present invention in some or all of its embodiments include an interconnect which can be made with standard semiconductor manufacturing techniques, having a small size, a high reading current after programming, may be fabricated using manufacturing process with a minimal number of steps, and a controlled radius interconnect filament through the dielectric after programming resulting in a repeatably manufacturable controlled low resistance link after programming. Furthermore, the present invention is characterized by high reliability in both the programmed and unprogrammed state. Other and further advantages of the present invention will appear hereinafter.

SUMMARY OF THE INVENTION

An electrically-programmable anti-fuse, having a low impedance after programming, is disclosed. It consists of a capacitor-like structure with very low leakage current before programming and a low-resistance after programming.

This low impedance anti-fuse element is formed by having a dielectric between two conductive electrodes In a preferred embodiment, or both two conductive electrodes may be made of a high electromigration immunity material and may be formed from either heavily doped polysilicon, heavily doped single crystal silicon, or refractory metal such as tungsten, molybdenum, platinum, titanium, tantalum, or their silicides or a sandwich of polysilicon and metal. Those of ordinary skill in the art will recognize that the metal may be any substance used to provide interconnect in integrated circuits or which is used as a diffusion barrier. In addition, it is believed that combinations of the above materials will function in the present invention. In other embodiments, lower electromigration immunity materials may be used as long as the current passed through the low impedance anti-fuse after programming is appropriately limited to assure proper lifetime.

The dielectric layer, single or composite, between the two electrodes is such that when it is disrupted by a high electric field it will facilitate the flow of one of the two electrodes to produce a controlled radius conductive filament during its breakdown. It requires a low amount of charge fluence to breakdown at the higher programming voltage with practically-used voltages and currents in integrated circuits. It also has a large enough charge fluence to breakdown at normal operating voltages to be a reliable circuit element during operation in its off state.

During programming, as the applied voltage reaches the dielectric breakdown, a localized weak spot in the dielectric starts to carry most of the leaking current and heats up, which, in turn, increases the leakage current A thermal runaway condition develops which results in localized heating and melting of the dielectric and adjacent electrode material. The conductive material flows from one of the two electrodes and forms a conductive filament shorting both electrodes. The thickness of the electrodes should be sufficient not to cause any discontinuity or pits during the filament formation The final radius of the filament depends on the composition and thickness of the dielectric, the electrode conductive material melting temperature, and the energy dissipated during programming. Lower final resistance of this element after its programming can be obtained with a larger radius and a lower resistivity of the formed filament and a lower spreading resistance of both electrodes. A larger filament radius and higher electromigration immunity of the conductive electrode material that flows to form the filament result in higher current carrying capacity of the programmed element without blowing open due to electromigration.

In a preferred embodiment, one of the conductors, the top electrode, is formed of heavily doped polysilicon of either n+ (or p+) or is a sandwich of said polysilicon and a metal above it and the other conductor, the lower electrode, is formed of heavily doped equal polarity n+ (or p+) diffusion region in a substrate or a well of opposite polarity p (or n). The dielectric in this embodiment is a three-layer sandwich formed of a bottom oxide layer of 20 A–50 A, a central silicon nitride layer of 40 A–100 A, and a top oxide layer of 0 A to 50 A.

The low-impedance anti-fuse element in the first preferred embodiment is programmed by applying a current-controlled voltage source across the two conductors (electrodes). The composition of the composite dielectric is such that the structure provides an on-resistance of less than 300 ohms after programming and an off-resistance of more than 100 Mohms before programming. The structure requires a programming pulse of magnitude less than 30 volts, a time duration of less than 100 mSec while supplying a current of less than 10 mAmps. The size of the conductive filament is a function of the programming pulse and the composition of the composite dielectric structure and its radius is in the range of 0.02 um to 0.2 um.

In a second and third embodiment of the low impedance anti-fuse element, the low impedance anti-fuse element or capacitor anti-fuse is between two conductors (metal lines of polysilicon lines). This facilitates the interconnect between two conductors without using the silicon substrate as a path. Hence, the substrate can be used for active devices.

Those of ordinary skill in the art will recognize that the technology of this invention is compatible with and may be applied to any semiconductor structure or process.

BRIEF DESCRIPTION OF THE DRAWINGS

FIG. 1 is a cross-section of a preferred embodiment of a low impedance anti-fuse element fabricated on a semiconductor substrate material in accordance with the present invention.

FIG. 2a is a cross-section of an alternative embodiment of a low impedance anti-fuse element according to the present invention having one metal electrode and one polysilicon electrode.

FIG. 2b is a cross-section of an alternative embodiment of a low impedance anti-fuse element according to the present invention having two metal electrodes.

FIG. 3 is a simplified cross-section of a low impedance anti-fuse element after programming.

FIG. 4 is a cross-section of a low impedance anti-fuse element like the embodiment disclosed with respect to FIG. 1 fabricated on a semiconductor substrate material wherein semiconductor material is employed as the electrically conducting material.

FIGS. 5a and 5b are schematic diagrams of the equivalent circuit of the low impedance anti-fuse element before and after programming.

FIGS. 6a-6f show a typical process for fabricating a low impedance anti-fuse element as a part of a silicon gate CMOS process.

FIG. 7 illustrates how the present invention may be incorporated into a typical bipolar process.

DETAILED DESCRIPTION OF THE PREFERRED EMBODIMENT

Referring first to FIG. 1, a preferred embodiment of the present invention is fabricated on a semiconductor substrate 10. Those of ordinary skill in the art will readily recognize that substrate 10 may in fact be a well region of one conductivity type fabricated in a semiconductor substrate of opposite conductivity type as is common in a CMOS process. In this embodiment, the bottom electrode 12 is a heavily doped diffusion area in substrate 10 and may be for example from $1 \times 10^{19}$ to $1 \times 10^{21}$ atom/cm$^3$ of arsenic or phosphorus if N-type. Bottom electrode 12 may be placed on substrate 10 by any of the known methods for creating such regions. It should be noted that bottom electrode 10 is heavily doped using a dopant which will create a semiconductor conductivity type opposite in polarity to that of the substrate 10. Therefore, if substrate 10 is P-type material, bottom electrode 12 should be heavily doped N-type diffusion and vice versa.

In this embodiment the insulating dielectric layer is a composite layer comprising oxide layer 14, silicon nitride layer 16, and top oxide layer 18. The dielectric layer may also be formed of a single insulator material which facilitates the flow of one of the electrodes when disrupted by a high electic field to create a controllable filament radius.

Top electrode 20 is formed from a material of equal polarity as the bottom electrode, so if the bottom electrode is N-type then top electrode may be formed of heavily doped N-type polysilicon having a sheet resistance of approximately 10 to 100 ohms/square. The thickness of the polysilicon may be from approximately 500 to 10,000 Angstroms, and may be approximately 4500 Angstroms in a preferred embodiment.

The top electrode 20 may also be a sandwich of said polysilicon layer and on top of it a conductive metal layer of Aluminum approximately 5,000 to 15,000 Angstroms.

In this embodiment, the thickness of the bottom oxide layer 14 of the composite dielectric is from 20 to 50 Angstroms, the thickness of the central silicon nitride layer is from 40 to 100 Angstroms, and the thickness of the top oxide layer 18 is from 0 to 50 Angstroms. The relative thickness of these layers are essential for manufacturing a reliable low impedance anti-fuse and a controlled filament of specific radius and conductivity as will be disclosed further herein.

The low impedance anti-fuse element of this embodiment is programmed by applying a current-controlled voltage source across the two electrodes. The composition of the composite dielectric is such that the structure provides an on-resistance of less than 300 ohms after programming and an off-resistance of more than 100 mega ohms before programming. The structure requires a programming pulse of magnitude less than 30 volts, a time duration of less than 100 mSec at a current of less than 10 mA. The size of the conductive filament is a function of the programming pulse and of the composition of the composite dielectric structure and its effective radius is in the range of from 0.02 uM to 0.2 uM.

As an example, a low impedance anti-fuse element having an N-diffusion of $1 \times 10^{21}$ atoms/cm lower electrode, a 4500 Angstrom highly-doped polysilicon upper electrode having a sheet resistance of 18 ohms/square, and a dielectric consisting of a first layer of approximately 40 Angstroms of Silicon dioxide ($SiO_2$), a second layer of approximately 70 Angstroms of silicon nitride ($Si_3N_4$), and a third layer of approximately 15 Angstroms of $SiO_2$ will produce a filament having an effective radius of approximately 0.05 microns if programmed with a pulse of approximately 18 v and a current of 1.0 mA for 100 mSec of duration. It has been found that the resulting filament resistance is less than 40 ohms. For the same 18 V programming voltage and 100 mSec of programming time, a current of 0.2 mA and 10 mA will produce a filament with effective radius from 0.04 microns to 0.2 microns.

It will be appreciated by those skilled in the art that conductivity of the dopants of substrate 10 lower electrode 12 and upper electrode 20 may be reversed i.e. substrate 10 may be N-type material and lower and upper electrodes 12 and 20 may be heavily doped P material.

Referring now to FIGS. 2a and 2b, an alternate embodiments of the low impedance anti-fuse will be disclosed wherein the two electrodes are above the substrate These embodiments facilitate the interconnect between two conductors without using the silicon substrate as a path. Hence, the substrate can be used for active devices.

Referring first to FIG. 2a the bottom electrode 40 of the low impedance anti-fuse element is fabricated of polysilicon which may be from approximately 500 to 10,000 Angstroms thick, covered by a silicide layer 42, which may be from approximately 100 to 5000 Angstroms thick. This reduces the sheet resistance of the polysilicon. Silicide layer 42 also serves to provide the molten substance which will create the filament through the dielectric. Silicide layer 42 may be of a silicide of tungsten, molybdenum, titanium or tantalum. Insulating oxide regions 44 are shown in FIG. 2a to indicate the type of environment which may be typically provided to isolate the low impedance anti-fuse element from other circuit elements on the silicon substrate.

Dielectric layer 46 is placed over the silicide layer 42 and also overlaps field oxide region 44. Dielectric layer 46 of the embodiment of FIG. 2a may be the sandwich structure disclosed with respect to the embodiment of FIG. 1. Dielectric layer 46 may also be formed of a single silicon nitride layer approximately 100–2000 Angstroms thick.

A barrier metal layer 48, such as titanium, tungsten, or titanium nitride is placed in between dielectric 46 and top electrode 50 (which may be made of aluminum) to prevent the diffusion of the material of the top electrode into the filament that is formed after programming. Barrier metal layer 48 may be from approximately 50 to 5000 Angstroms thick.

Turning now to FIG. 2b the low impedance anti-fuse element of this embodiment has a lower electrode 60 which may be a metal such as aluminum, covered with a layer of a barrier metal, such as tungsten, titanium, or titanium nitride to prevent the diffusion of the aluminum metal into the filament as discussed with respect to FIG. 2a. Insulating oxide regions 64 are shown as a method to isolate the low impedance anti-fuse element from other circuit elements on the silicon substrate. A layer 66, preferably formed of tungsten silicide is interposed between barrier metal layer 62 and dielectric layer 68 through which the filament will be formed. Layer 66 is used to provide the molten substance from which the filament will be formed when the low impedance anti-fuse element is programmed. A barrier metal layer 70 is interposed between dielectric layer 68 and top electrode 72, which may be a metal such as aluminum in order to prevent the material of the top electrode from diffusing into the filament material. The thicknesses of the layers in the embodiment of FIGS. 2a and 2b may be similar.

The low impedance anti-fuse element of the embodiments depicted in FIGS. 2a and 2b may be programmed by application of a voltage of from approximately 10 to 30 volts between the two electrodes depending on the thickness of the dielectric. The programming pulse should be at a duration of approximately less than 100 mSec and at a current of approximately less than 10 mA.

Referring now to FIG. 3 a simplified cross-section of the low impedance anti-fuse element after programming, shows a lower electrode 80 and upper electrode 82 with a dielectric layer 84 interposed in between. A controlled-radius filament 86 has been caused to form in the dielectric layer and is composed of the electrode material. As will be readily understood by those of ordinary skill in the art, the radius of the conductive filament controls the on-resistance of the low impedance anti-fuse element after programming. The use of a high electromigration immunity material and a controlled radius filament results in adequate reliability with current flow and an immunity from the low impedance anti-fuse element causing itself to unprogram after considerable use due to electromigration of the filament material As mentioned, lower electromigration immunity materials may be used so long as the operating current is below a value which will cause considerable electromigration of the filament material during the device lifetime.

The preferred embodiments of the low impedance anti-fuse element illustrated herein may be integrated into a standard integrated circuit technology using N+ polysilicon as the top electrode and using an N+ diffusion in a P substrate or P-well as the bottom electrode. This embodiment is discussed with respect to FIG. 4.

Referring now to FIG. 4, the low impedance anti-fuse element is constructed in P-substrate or P-well 100. Field oxide regions 102 isolate the low impedance anti-fuse element structure from other circuit elements. Heavily doped N+ diffusion region 104 forms the bottom electrode for the low impedance anti-fuse. Dielectric layer 106 separates lower electrode 104 from upper electrode 108 which may be heavily doped N+ polysilicon. Connections to lower electrode 104 and upper electrode 108 are shown schematically at 110 and 112 respectively. In the embodiment of FIG. 4 both the bottom electrode 104 and top electrode 108 can be contacted to metal layers to reduce interconnect resistance.

FIGS. 5a and 5b illustrate schematically the equivalent circuit of the low impedance anti-fuse before and after programming respectively. In FIG. 5a parasitic diode 120 inherently exists between the substrate 100 and N+ diffusion region 104 forming the lower electrode in FIG. 4. Off capacitor 122 represents the capacitor formed by lower electrode 104 and upper electrode 108.

After programming, parasitic diode 120 is now seen connected to resistor 124 which represents the inherent on-resistance of the controlled-radius filament formed during programming, connecting lower electrode 104 with upper electrode 108 and the spreading resistance of the top and bottom electrodes. In both FIGS. 5a and 5b, the three terminals of the equivalent circuit are terminal 100, the substrate of FIG. 4, terminal 110 (the equivalent terminal 110 in FIG. 4) and terminal 112 (the equivalent terminal 112 of FIG. 4).

While the discussions involving FIGS. 4, 5a and 5b have assumed P substrates and N diffusions, those of ordinary skill in the art will readily recognize that N type substrates or wells and P diffusions could be used as effectively. If that is the case it will be immediately recognized that diodes 120 of FIGS. 5a and 5b will have their anodes at terminal 110 and their cathodes at terminal 100.

As illustrated in FIGS. 6a–6f, the preferred embodiments of the present invention are easily incorporated into standard silicon integrated circuit manufacturing processes. The disclosure herein relates to a CMOS process, but those of ordinary skill in the art will readily recognize how the low impedance anti-fuse formation could be incorporated into NMOS, PMOS or other processes.

First, as shown in FIG. 6a, the silicon wafers have been processed utilizing a standard CMOS silicon gate process to the point where the low impedance anti-fuse is to be incorporated in an appropriate area. Specifically, N-type substrate 150 has been prepared by creating boron channel stop implants 152, boron P-well 154, field oxide regions 156 and initial gate oxide layer 158 using conventional CMOS processing technology. A polysilicon layer has been created and defined to form gates 160 and 162 for N-channel and P-channel devices respectively.

The arsenic or phosphorus doping step for source/drain regions 164 of the N-channel device in P-well 154 also forms the first step for creation of the low impedance anti-fuse, since an extra aperture in photo resist mask 166 allows for doping the P-well 154 at region 168 to create the lower electrode of the low impedance anti-fuse simultaneously with the N-channel source/drain doping step.

The initial gate oxide layer 158 is then etched to the bare substrate and cleaned in preparation for growing dielectric layer 170.

Referring now to FIG. 6b, the dielectric layer 170 of the low impedance anti-fuse is next formed on the entire surface of the substrate. In a preferred embodiment, a first layer of silicon dioxide is either deposited or thermally grown. A silicon nitride layer is next deposited using standard LPCVD or CVD techniques. A final layer of silicon dioxide is then either deposited or thermally grown. The processes used to form these layers may be conventional processing steps known to those skilled in the art.

Referring now to FIG. 6c, a layer of polycrystalline silicon, region 172, is then formed over the entire surface of the wafer. Region 172 may be fabricated with standard LPCVD or CVD techniques. Referring to FIG. 6c, a photomask 174 has been used to delineate the polycrystalline silicon layer 172 to form the upper electrode of the low impedance anti-fuse. This shaped upper electrode 176 is then used as a mask to selectively remove the silicon dioxide/silicon nitride/silicon dioxide dielectric sandwich insulating layer from areas outside of the low impedance anti-fuse structure. The structure is then sealed with a thin thermal oxide layer 178, as shown in FIG. 6d.

The process of manufacturing the remainder of the CMOS circuit can then continue in a standard manner to form the finished device as illustrated in FIG. 6e. The boron source and drain regions 180 and 182 for the P-channel devices are implanted, using a photomask 184 and the portion of polysilicon gate layer 162 to protect the areas outside the implant regions. Referring to FIG. 6f, a polysilicon glass passivation layer 186 is deposited, flowed and contact cuts are made. Metal layer 188 is then deposited and delineated making connections to the transistors low impedance anti-fuse nodes. If dual layer metal is to be used, an interlayer dielectric is deposited and a second layer of metal is deposited, delineated and annealed (not shown). Finally, a passivation layer is deposited for scratch protection and the metal pads are opened.

The low impedance anti-fuse element can also be applied to bipolar process for either PROM cells or programmable logic devices. The preferred embodiment would be the same as the CMOS embodiment. Such a process is disclosed in conjunction with FIG. 7. The process would begin as a conventional bipolar process, first the buried layer would be defined and diffused in, followed by the epitaxial deposition and isolation process. There are several methods for performing isolation and diffusion, all of which will work with the low impedance anti-fuse element. The base region would then be defined and diffused. The emitter would then be defined and diffused followed by the contact cuts. This is the preferred point where the low impedance anti-fuse element could be defined by forming the dielectric, followed by the poly deposition, doping and delineation. The underlying dielectric would then be removed from the unwanted areas utilizing the poly as mask. Following the definition of the low impedance anti-fuse element the metalization process would proceed as normal. Either single or dual metal processes may be used.

While embodiments and applications of this invention have been shown and described, it would be apparent to those skilled in the art that many more modifications are possible without departing from the inventive concepts herein. The invention, therefore, is not to be restricted except in the spirit of the appended claims.

What is claimed is:

1. A method for manufacturing a programmable low impedance anti-fuse element on a substrate in a CMOS fabrication process including the steps of:

defining and doping with a first conductivity type, a first region in said substrate for forming the lower electrode of said programmable low impedance anti-fuse element simultaneously with a definition and doping of the source and drain regions in said substrate, removing the initial gate oxide layer in said first region, forming a dielectric layer for said programmable low impedance circuit interconnect element over said region, said dielectric layer including a first silicon dioxide portion, a second silicon nitride portion over said silicon dioxide portion, and a third silicon dioxide portion over said second silicon nitride portion, forming a conductive layer to form the upper electrode for said programmable low impedance circuit interconnect element over said dielectric layer, defining said conductive layer and said dielectric layer, continuing said CMOS process sequence.

2. The method of claim 1 wherein the conductive layer forming the upper electrode is fabricated of polysilicon having a conductivity type the same as said first region.

3. The method of claim 1 including the further step of applying a voltage between said lower electrode and said upper electrode sufficient in magnitude to cause the formation of a conductive filament in said dielectric layer.

4. A method of forming a programmable low impedance anti-fuse element in a bipolar fabrication process including the steps of:

defining a region in the emitter for use as the lower electrode of said programmable low impedance anti-fuse element, forming a dielectric layer over said defined region, said dielectric layer including a first silicon dioxide portion, a second silicon nitride portion over said silicon dioxide portion, and a third silicon dioxide portion over said second silicon nitride portion, forming an upper electrode conductor region, defining said upper electrode conductor region and said dielectric region, continuing said bipolar fabrication process sequence.

5. The method of claim 4 wherein said upper electrode conductor region is fabricated of polysilicon having a conductivity type the same as said emitter.

6. The method of claim 4 including the further step of applying a voltage between said lower electrode and said upper electrode sufficient in magnitude to cause the formation of a conductive filament in said dielectric layer.

* * * * *